United States Patent
Bessho et al.

[11] Patent Number: 6,038,158
[45] Date of Patent: Mar. 14, 2000

[54] SEMICONDUCTOR MEMORY

[75] Inventors: Shinji Bessho, Suita; Shunichi Sukegawa, Tsukuba; Masayuki Hira, Tokorozawa; Yasushi Takahashi, Urawa; Tsutomu Takahashi, Tachikawa; Kohji Arai, Kodaira, all of Japan

[73] Assignee: Texas Instruments Incorporated, Dallas, Tex.

[21] Appl. No.: 09/189,071

[22] Filed: Nov. 9, 1998

[51] Int. Cl.⁷ .................................. G11C 5/02; G11C 7/00
[52] U.S. Cl. ............................ 365/51; 365/63; 365/190; 365/203; 365/207
[58] Field of Search ................................ 365/51, 63, 190, 365/203, 207, 208, 205

[56] References Cited

U.S. PATENT DOCUMENTS

| | | | |
|---|---|---|---|
| 4,570,241 | 2/1986 | Arzubi | 365/205 |
| 5,107,459 | 4/1992 | Chu et al. | 365/63 |
| 5,555,203 | 9/1996 | Shiratake et al. | 365/51 |

*Primary Examiner*—Throng Phan
*Attorney, Agent, or Firm*—Bret J. Petersen; Richard L. Donaldson

[57] ABSTRACT

The objective is to realize a semiconductor memory capable of avoiding an increase in the load of the sense amplifiers, easily realizing a large capacity and high integration of the memory, reducing the current consumption by the bit lines, and improving the access speed. Because the levels of the selection signal lines SHUS1, SHUE1, SHDS1, and SHDE1 are set by the control circuit, only one of the aforementioned four selection signal lines is selected at the time of memory access, other selection signal lines are held in unselect status, and the sense amplifiers in the sense amplifier bank SB1*a* and prescribed bit line pairs or extended bit line pairs are connected to each other by response in order to carry out read or write; thus, the load of the sense amplifiers can be reduced, and high speed, large capacity, and high integration can be achieved.

12 Claims, 5 Drawing Sheets

SEMICONDUCTOR MEMORY

FIELD OF THE INVENTION

The present invention pertains to a semiconductor memory; particularly, to a semiconductor memory capable of reducing the power consumption on the bit lines and realizing a large capacity and high-speed access through the utilization of the extended bit line (EXBL) method.

BACKGROUND OF THE INVENTION

A semiconductor memory, for example, a DRAM (dynamic random access memory), is configured with one or several memory cell arrays; wherein, within each memory cell array, several memory cells are arranged in a matrix, the memory cells on each row are connected to the same word line, and the memory cells on each column are connected to the same bit line. At the time of memory access, because a prescribed word line is selected and activated by a word line driving circuit, and a prescribed bit line is selected by a selection gate in response to an address signal input, the memory cell connected to both the selected word line and the bit line is selected, and access, such as write or read, is given to the memory cell via a sense amplifier.

FIG. 6 is a block diagram showing a configuration example of a common DRAM. As shown in the figure, the DRAM in this example is configured with 4 memory cell arrays SM0, SM1, SM2, and SM3; word line driving circuits WD01, WD02, ..., WD31, and WD32 attached to respective memory cell arrays; and sense amplifier banks SB0, SB1, ..., and SB4.

As shown in the figure, word line driving circuits are provided on both sides of respective memory cell arrays in the direction of the word line, and the sense amplifier banks are provided respectively on both sides thereof in the direction of the bit line.

A prescribed word line is selected and activated by the word line driving circuits provided on one side of the memory cell arrays at the time of memory access. Also, a prescribed bit line sense amplifier is selected by the selection gates in respective sense amplifier banks and connected to an input buffer.

The aforementioned word line driving circuits and the selection gate in respective sense amplifier banks are controlled respectively by a row decoder and a column decoder not shown in the figure.

In addition, neighboring memory cell arrays share the sense amplifier bank provided between them for common use. For example, the memory cell arrays SM0 and SM1 share the sense amplifier bank SB1, and the memory cell arrays SM1 and SM2 share the sense amplifier bank SB2.

As a result, the number of sense amplifiers can be reduced, and the area for the circuits can be reduced, offering an advantage as to the realization of a large capacity.

FIG. 7 is circuit diagram in which a portion of the DRAM shown in FIG. 6 is enlarged in order to show the details of the internal configuration thereof. Here, the internal configurations of the memory cell array SM1, the sense amplifier banks SB1 and SB2, and the word line driving circuits WD11 and WD12 provided around the memory cell array are shown.

As shown in the figure, the sense amplifier banks SB1 and SB2 are configured with several sense amplifiers, respectively. For example, the sense amplifier bank SB1 is configured with sense amplifiers SA0, SA2, ... with even numbers; and the sense amplifier bank SB2 is configured with sense amplifiers SA1, SA3, ... with odd numbers.

In the case of a semiconductor memory with such configuration, each memory cell array has almost the same configuration. Also, other sense amplifier banks SB1, SB2, and SB3 have the same configuration as the sense amplifier banks SB0 and SB4. Furthermore, the sense amplifier banks SB0 and SB4 are fundamentally identical to other sense amplifier banks in terms of their configuration except for the fact that they are connected to the memory cell array only by one side.

Here, the memory cell array SM1 and the sense amplifier banks SB1 and SB2 shown in FIG. 7 are taken as an example to explain their respective configurations and operations.

As shown in the figure, a bit line pair comprising 2 bit lines is connected to respective sense amplifiers SA0, SA1, SA2, SA3, ... via 2 selection gates.

Among the several word lines and bit lines provided in the memory cell array SM1, only the bit lines BL0 and BL0_ connected to the sense amplifier SA0, the bit lines BL1 and BL1_ connected to the sense amplifier SA1, the bit lines BL2 and BL2_ connected to the sense amplifier SA2, the bit lines BL3 and BL3_ connected to the sense amplifier SA3, the word line WLj connected to the word line driving circuit WD11, and the word line WLj+1 connected to the word line driving circuit WD12 are shown.

The 2 bit lines connected to the sense amplifier will be referred to as a bit line and a complementary bit line, respectively, hereinafter. For example, a bit line BL0 and a complementary bit line BL0_ are connected to the sense amplifier SA0, and a bit line BL1 and a complementary bit line BL1_ are connected to the sense amplifier SA1.

As shown in the figure, memory cells are provided at the intersections of the bit line and the complementary bit line and the word lines. For example, the memory cell $MC_{0,j}$ is provided at the intersection of the bit line BL0 with the word line WLj, and the memory cell $MC_{0,j+1}$ is provided at the intersection of the bit line BL0_ with the word line WLj+1. Similarly, the memory cell $MC_{1,j}$ is provided at the intersection of the bit line BL1 with the word line WLj, and the memory cell $MC_{1,j+1}$ is provided at the intersection of the bit line BL1_ with the word line WLj+1.

Furthermore, in FIG. 7, positions of respective memory cells are indicated by dots, and the configuration of the memory cell is omitted. For example, the memory cell is a common DRAM memory cell configured with 1 transistor and 1 capacitor.

The sense amplifiers in the sense amplifier banks SB1 and SB2 are connected to respective bit lines and the complementary bit lines via selection gates. For example, the sense amplifier SA0 is connected to the bit line BL0 via the selection gate TG0 and further connected to the supplementary bit line BL0_ through the selection gate TG0_. Similarly, the sense amplifier SA1 is connected to the bit line BL1 via the selection gate TG1 and further connected to the supplementary bit line BL1_ through the selection gate TG1_.

For example, the selection gate is configured with an nMOS transistor, and the gates of these nMOS transistors are connected to selection signal lines T1, T2, T3, and T4, respectively.

Furthermore, the selection signal lines T1, T2, T3, and T4 are connected, for example, to the control circuit of a row decoder not shown in the figure; whereby, a prescribed signal line is selected and activated by said control circuit.

As the prescribed selection signal is selected and activated at the time of memory access, a prescribed selection gate is turned on. For example, when the selection signal line T2 is selected, said selection signal line T2 is held to a high-level, for example, to the source voltage $V_{DD}$ level, by the control circuit. Accordingly, the bit line BL0 and the supplementary bit line BL0_ are connected to the sense amplifier SA0, and the bit line BL2 and the supplementary bit line BL2_ are connected to the sense amplifier SA2; and, as a result, write to/read from the memory cell connected to the supplementary bit line BL0_, the bit line BL0_, the bit line BL2, and the supplementary bit line BL2_ becomes enabled.

Memory capacities of respective memory cell arrays in a semiconductor memory, such as the conventional DRAM described above, are on the increase following high-integration and enlarged capacities of semiconductor devices. Accordingly, the number of the memory cells connected to the bit lines and the complementary bit lines on one side increases, showing a tendency that resistance and capacitive load of the bit lines and the supplementary bit lines increase during read or write.

As the resistance and the capacitive load of the bit lines or the supplementary bit lines increase, a variety of problems occur at the time of memory access. For example, read speed falls during read, or accuracy of read deteriorates. Although a method is available to avoid said the problem, in which the number of the sense amplifiers is increased to reduce the load of respective sense amplifiers, this method increases the ratio of the area occupied by the sense amplifiers to that of the [entire] chip, resulting in a disadvantage in that wiring efficiency deteriorates or the chip area increases.

The extended bit line method is being suggested in order to solve the aforementioned problems. FIG. 8 is a circuit diagram showing the concept of the extended bit line method.

As shown in the figure, the bit line and the complementary bit line connected to the sense amplifier SA are split in 2 near the middle, and of the 2 split portions, those closer to the sense amplifier SA are connected to the sense amplifier SA as a bit line BL and a complementary bit line BL_, and those farther [from the sense amplifier] as an extended bit line EXBL and an extended complementary bit line EXBL_. The extended bit line EXBL and the extended complementary bit line EXBL_ [sic; EXBL] are connected to the sense amplifier (SA) via metallic wiring ML and ML_.

Furthermore, like the bit line and the complementary bit line BL_, the extended bit line EXBL and the extended complementary bit line EXBL_ are formed on a polysilicon layer, and the metallic wiring ML and ML_ are formed on a metallic layer deposited above the polysilicon layer. Furthermore, contact holes not shown in the figure are created between the metallic wiring ML and the extended bit line EXBL or between the metallic wiring ML_ and the extended complementary bit line EXBL_ for the connection of respective wiring.

However, with the extended bit line method, because the sense amplifier is connected to the bit line pair and the extended bit line pair, separate selection gates need to be provided. As shown in the figure, selection gates TC and TG_ are laid between the sense amplifier SA and the bit line BL as well as the complementary bit line BL_, respectively; and selection gates TGE and TGE_ are laid between the sense amplifier SA and the bit line EXBL as well as the complementary bit line EXBL_, respectively.

The gates of the selection gates TG and TG_ are connected to a selection signal line SHRS, and the gates of the selection gates TGE and TGE_ are connected to a selection signal line SHRE.

Access can be made to the memory cell connected to the bit line BL and the complementary bit line BL_ by selecting and activating the selection signal line SHRS, and access can be made to the memory cell connected to the bit line EXBL and the complementary bit line EXBL_ by selecting and activating the selection signal line SHRE.

With the aforementioned extended bit line method, resistance and capacitive load of the bit line connected to the sense amplifier can be reduced, fall in the access speed and deterioration of reading accuracy can be prevented, and a large memory capacity can be realized. However, as shown in the figure, separate selection gates are needed for the bit line pairs and the extended bit line pairs connected to respective sense amplifiers, and 4 control signal lines are needed for each sense amplifier to control the selection gates when the bit line and the extended bit line are provided symmetrically on both sides of the sense amplifier. In the case of the conventional DRAM shown in FIG. 7, only 2 selection signal lines are needed for each sense amplifier to control the selection gates. Therefore, the control circuit of the conventional semiconductor memory cannot be used, so a new control circuit is needed.

The present invention was made in the light of this situation, and its purpose is to present a semiconductor memory with which the memory capacity can be increased while reducing the resistance and the capacitive load of the bit line through the realization of a control circuit capable of generating a selection signal for the selection of a bit line and an extended bit line using the extended bit line method.

SUMMARY OF THE INVENTION

In order to achieve the aforementioned goal, the semiconductor memory of the present invention has a first and a second memory cell array in which memory cells are formed at the intersections of several bit line pairs and several extended bit line pairs extending in the same direction as that of said bit line pairs with several word lines, sense amplifier bank parts which are provided between the aforementioned memory cell arrays and contain several sense amplifiers respectively connected to the bit line pair of the aforementioned first memory cell array via a first switching means, connected to the extended bit line pair of the aforementioned first memory cell array via a second switching means, connected to the bit line pair of the aforementioned second memory cell array via a third switching means, and connected to the extended bit line pair of the aforementioned second memory cell array via a fourth switching means, and a control circuit to control the conduction/nonconduction of the aforementioned first, second, third, and fourth switching means; wherein, the aforementioned control circuit makes one of the aforementioned first, second, third, and fourth switching means conductive and others nonconductive in response to an address signal at the time of memory access.

In addition, the semiconductor memory of the present invention has a precharge circuit to precharge the aforementioned bit line pair and the aforementioned extended bit line pair to a prescribed voltage, the aforementioned control circuit makes the aforementioned first, second, third, and fourth switching means conductive, and the aforementioned bit line pair and the extended bit line pair are precharged by the aforementioned precharge circuit during stand-by status prior to memory access.

In addition, in the present invention, the aforementioned first, second, third, and fourth switching means are configured with transistors, and a control signal is applied to their control terminals respectively from the aforementioned control circuit.

Furthermore, in the present invention, the aforementioned control circuit applies a voltage higher than the source voltage to the control terminal of one of the aforementioned transistors and a common potential to other transistors at the time of memory access.

In the present invention, the bit line pair and the extended bit line pair are provided on both sides of respective sense amplifiers, and the sense amplifiers are connected to the bit line pairs and the extended bit line pairs respectively via switching means. Because the control circuit selects only 1 of the 4 switching means connected to each sense amplifier, makes it conductive, and maintains other switching means nonconductive at the time of memory access, increase in the load of the sense amplifiers can be avoided, a large capacity and high-integration of the memory can be realized easily, current consumption by bit lines can be reduced, and the access speed can be improved.

REFERENCE NUMERALS AND SYMBOLS AS SHOWN IN THE DRAWINGS

In the figures SB1$a$, SB2$a$, SB0, SB1, . . . , SB4 represent sense amplifier banks, SM1$a$, SM0, SM1, . . . , SM4 represent memory cell arrays, WD1$a$, WD2$a$, WD01, WD02, WD11, WD12, . . . , WD31, WD32 represent word line driving circuits, SA0, SA1, SA2, SA3 represent sense amplifiers, PT1 represents a pMOS transistor, NT1 represents a nMOS transistor, NTD1 represents a depletion type nMOS transistor, 10, 20, 30, 40 represent OR gates, 11, 21, 31, 41 represent NAND gates, 12, 22, 32, 42, 50 represent inverters, 13, 23, 33, 43, 51 level shifters, 14, 16, 18, 24, 26, 34, 36, 38, 44, 46 represent NOR gates, 15, 17, 25, 27, 35, 37, 45, 47 represent inverters, 100 represents a control circuit, 110, 120, 130, 140, 150, 160, 170, 180 represent driving buffers.

DESCRIPTION OF EMBODIMENTS

Configuration and operation of the semiconductor memory of the present invention; for example, a DRAM for which the extended bit line method is adopted, will be explained with reference to the figures.

Figure 1:
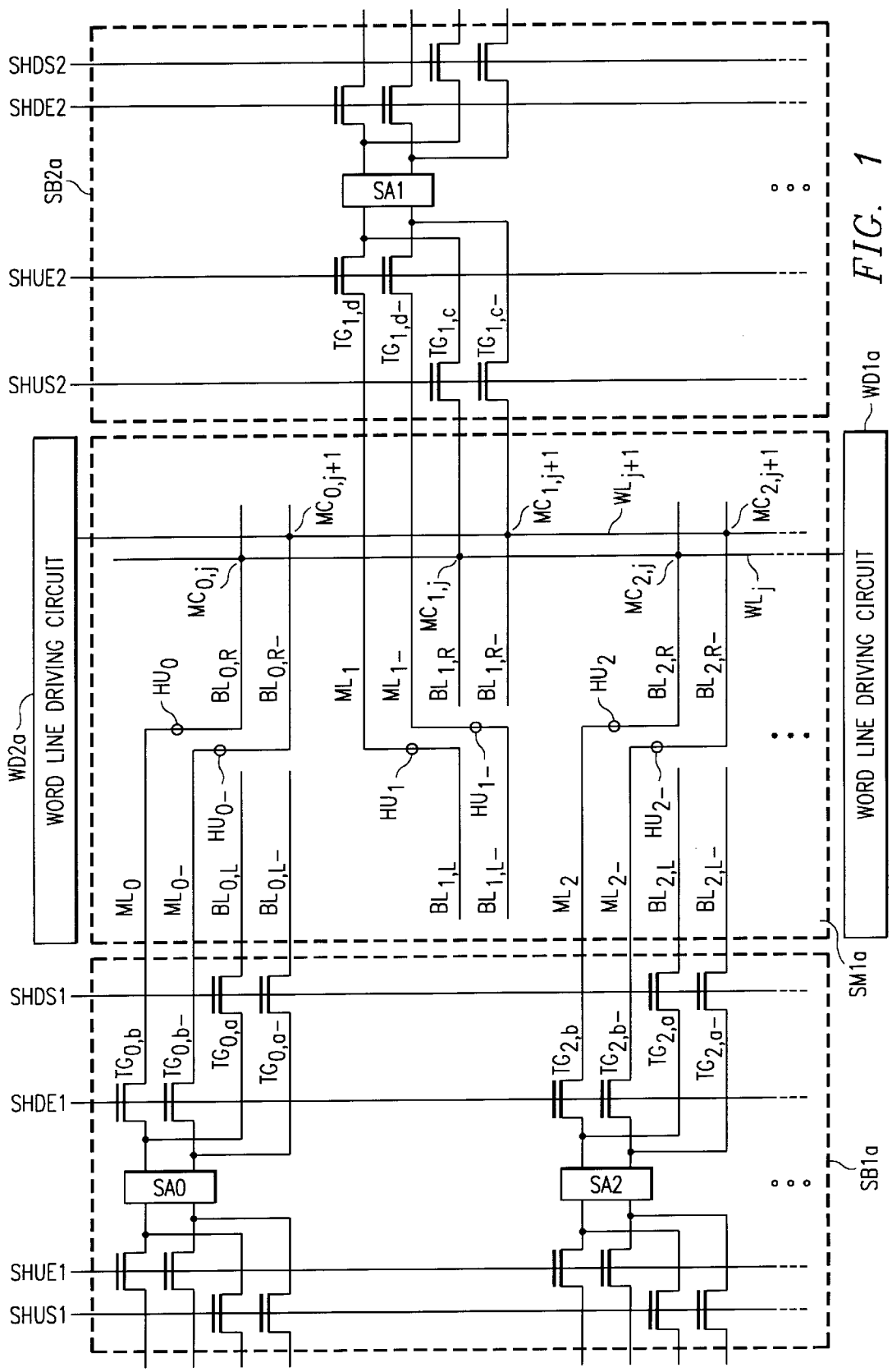
FIG. 1 is a circuit diagram showing an embodiment of the semiconductor memory pertaining to the present invention.

FIG. 1 is a circuit diagram showing an embodiment of the semiconductor memory pertaining to the present invention.

As shown in the figure, the semiconductor memory of the present embodiment is configured with a memory cell array SM1$a$, sense amplifier banks SB1$a$ and SB2$a$, and word line driving circuits WD1$a$ and WD2$a$.

The extended bit line method is adopted for the present embodiment; wherein, for example, 256 sets of bit line pairs and extended bit line pairs are provided for the memory cell array SM1$a$, and 512 word lines are further provided to cross these bit line pairs and extended bit line pairs. Sense amplifier banks SB1$a$ and SB2$a$ are provided on each side of the memory cell array SM1$a$ in the direction of the bit lines, and word line driving circuits WD1$a$ and WD2$a$ are provided on each side in the direction of the word lines, respectively.

The sense amplifier banks SB1$a$ and SB2$a$ are provide with 128 sense amplifiers SA$i$ i=0, 1, 2, . . . , 255, respectively. For example, the sense amplifier bank SB1$a$ is provided with the sense amplifiers SA0, SA2, . . . , and SA254; and the sense amplifier banks SB2$a$ is provided with the sense amplifiers SA1, SA3, . . . , and SA255. Furthermore, only the sense amplifiers SA0, SA1 and SA2 are shown in FIG. 1. In addition, the sense amplifier banks SB1$a$ and SB2$a$ are placed for common use by the memory cell arrays provided on both sides thereof.

The 256 sets of bit line pairs and the extended bit line pairs are connected respectively to the sense amplifiers SA$i$ in the sense amplifier banks SB1$a$ and SB2$a$. The selection gate is configured, for example, with an nMOS transistor connected to the selection signal line by the gate. Four selection signal lines are connected to respective sense amplifier banks, and these selection signal lines are connected to a control circuit not shown in the figure; whereby, a prescribed selection signal line is selected and activated by said control circuit.

In addition, the 512 word lines are connected by 256 lines to respective word line driving circuits WD1$a$ and WD2$a$. Furthermore, in FIG. 1, only a pair of neighboring word lines WL$_j$ and WL$_{j+1}$ j=0, 1, 2, . . . , 510 are shown for the sake of explanation.

Address information not shown in the figure is input into the word line driving circuits WD1$a$ and WD2$a$ at the time of memory access; and in response, the word line driving circuits WD1$a$ and WD2$a$ select 1 of the 512 word lines and hold it activated at a high level.

In addition, a prescribed selection signal line is selected and activated by the control circuit. In response, a prescribed gate is turned on. For example, if a selection signal line SHDS1 is selected, it is held to a high level, for example, to the source voltage V$_{DD}$ level, by the control circuit. Because the bit line BL$_{0,L}$ and the complementary bit line BL$_{0,L\_}$ are connected to the sense amplifier SA0, and the bit line BL$_{2,L}$ and the complementary bit line BL$_{2,L\_}$ are connected to the sense amplifier SA2 in response, read to/write from the memory cell array connected to the bit line BL$_{0,L}$, the complementary bit line BL$_{0,L\_}$, the bit line BL$_{2,L}$, and the complementary bit line BL$_{2,L\_}$ becomes enabled.

Configuration of the memory cell array SM1$a$ will be explained below in reference to FIG. 1.

In the memory cell array SM1$a$, 1 memory cell is provided at respective intersections of the bit lines or the complementary bit lines with the word lines; and similarly, 1 memory cell is provided at respective intersections of the extended bit lines or the extended complementary bit lines with the word lines. Furthermore, only memory cells MC$_{0,j}$, MC$_{0,j+1}$, MC$_{1,j}$, MC$_{1,j+1}$, MC$_{2,j}$, and MC$_{2,j+1}$ are shown in FIG. 1 as an example. Also, in FIG. 1, positions of the memory cells are indicated by the dots provided at the intersections of the word line with the bit lines and the complementary bit lines or at the intersections of word line with the extended bit lines and the extended complementary bit lines, and the configuration of the memory cell is omitted. The memory cell is to be configured, for example, with 1 transistor and 1 capacitor.

Each bit line and complementary bit line is split laterally into 2 at the middle point of the memory cell array SM1$a$. For example, the bit line pair $BL_{0,L}$ and $BL_{0,L\_}$ on the left side is connected to the sense amplifier SA0, and the bit line pair $BL_{0,R}$ and $BL_{0,R\_}$ on the right side is connected to the sense amplifier SA0 via an upper-layer wiring pair $ML_0$ and $ML_{0\_}$ formed on a layer above the bit line. $HU_0$ and $HU_{0\_}$ are through-holes connecting the upper-layer wiring pair $ML_0$ and $ML_{0\_}$ to the bit line pair $BL_{0,R}$ and $BL_{0,R\_}$ on the right. Other bit line pairs have the same configuration. Here, the bit line connected to the sense amplifier via the upper layer wiring is referred to as an extended bit line. On the other hand, the bit line connected directly to the sense amplifier is referred to as a regular bit line, or simply as a bit line.

A sense amplifier is connected to a bit line pair via selection gates. For example, the sense amplifier SA0 is connected to the bit line pair $BL_{0,L}$ and $BL_{0,L\_}$ via the selection gates $TG_{0,a}$ and $TG_{0,a\_}$ and further connected to the extended bit line pair $BL_{0,R}$ and $BL_{0,R\_}$ via the selection gates $TG_{0,b}$ and $TG_{0,b\_}$. The gates of the selection gates $TG_{0,a}$ and $TG_{0,a\_}$ are connected to the selection signal line SHDS1, and the gates of the selection gates $TG_{0,b}$ and $TG_{0,b\_}$ are connected to the selection signal line SHDE1. Thus, the bit line pair to be connected to the sense amplifier SA0 can be selected by controlling the voltage levels of the selection signal lines SHDS1 and SHDE1. For example, when the selection signal lines SHDE1 is held to a low level, and the selection signal lines SHDS1 at a high level, the selection gates $TG_{0,a}$ and $TG_{0,a\_}$ are turned on, and the selection gates $TG_{0,b}$ and $TG_{0,b\_}$ are turned off. As a result, the sense amplifier SA0 is connected to the bit line pair $BL_{0,L}$ and $BL_{0,L\_}$, and the upper layer wiring $ML_0$ and $ML_{0\_}$ is detached from the sense amplifier SA0.

The same holds true of other sense amplifiers. Furthermore, in FIG. 1, although the selection gates and the sense amplifier are provided separately, the selection gates may be provided inside of the sense amplifier in the actual circuit. The selection signal lines SHUS1, SHUE1, SHDS1, SHDE1, SHUS2, SHUE2, SHDS2, and SHDE2 which control the on/off of the control gates are connected to a control circuit not shown in the figure, and the signal levels thereof are controlled respectively by the control circuit.

Figure 2:
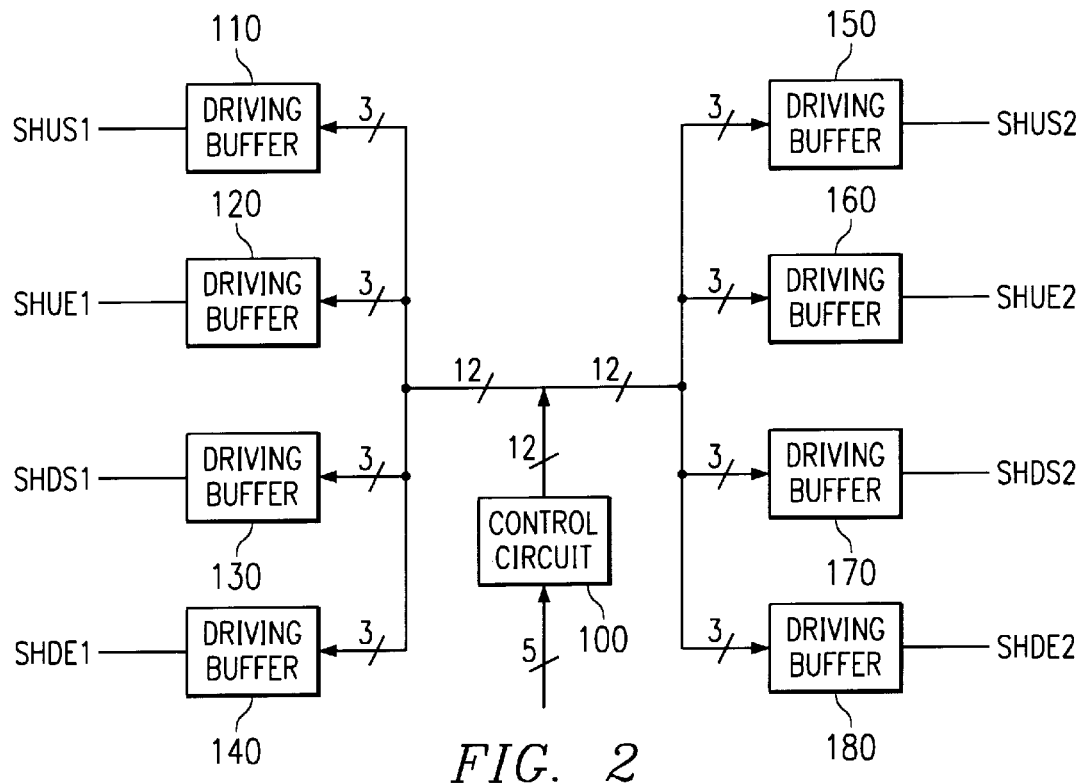
FIG. 2 is a diagram showing the control circuit for the selection signal lines and the configuration of the driving buffers.

FIG. 2 is a block diagram showing the configuration of the driving buffer for driving the selection signal lines in response to the control circuit and the signal from said control circuit.

As shown in the figure, the control circuit 100 generates an output of a 12 bit control signal in response to an input of a 5 bit signal. Then, the 12 bit control signal is split into 2, of which one part is input into driving buffers 110 through 140, and the other part into driving buffers 150 through 180.

A 3 bit control signal is input into respective driving buffers. In response to the 3 bit input signal, the driving buffers control the selection signal lines SHUS1 through SHDE1 and SHUS2 through SHDE2, respectively.

For example, in response to the 3 bit input signal, the driving buffer 110 controls the selection signal line SHUS1, and the driving buffer 120 controls the selection signal line SHUE1 in response to the 3 bit input signal.

Figure 4:
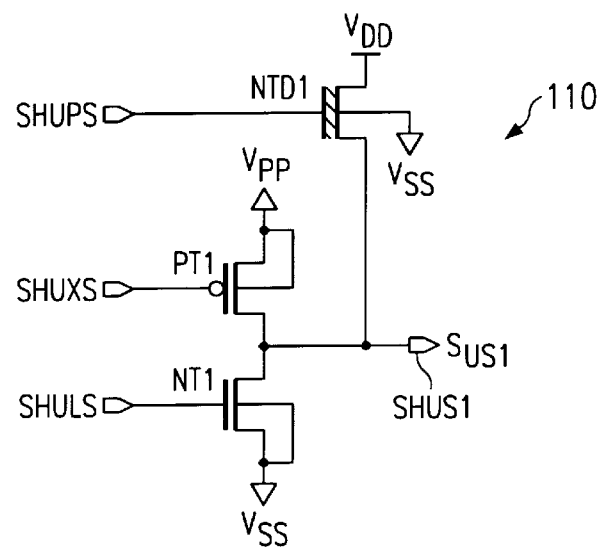
FIG. 4 is a circuit diagram showing the configuration of the driving buffer.
Figure 3:
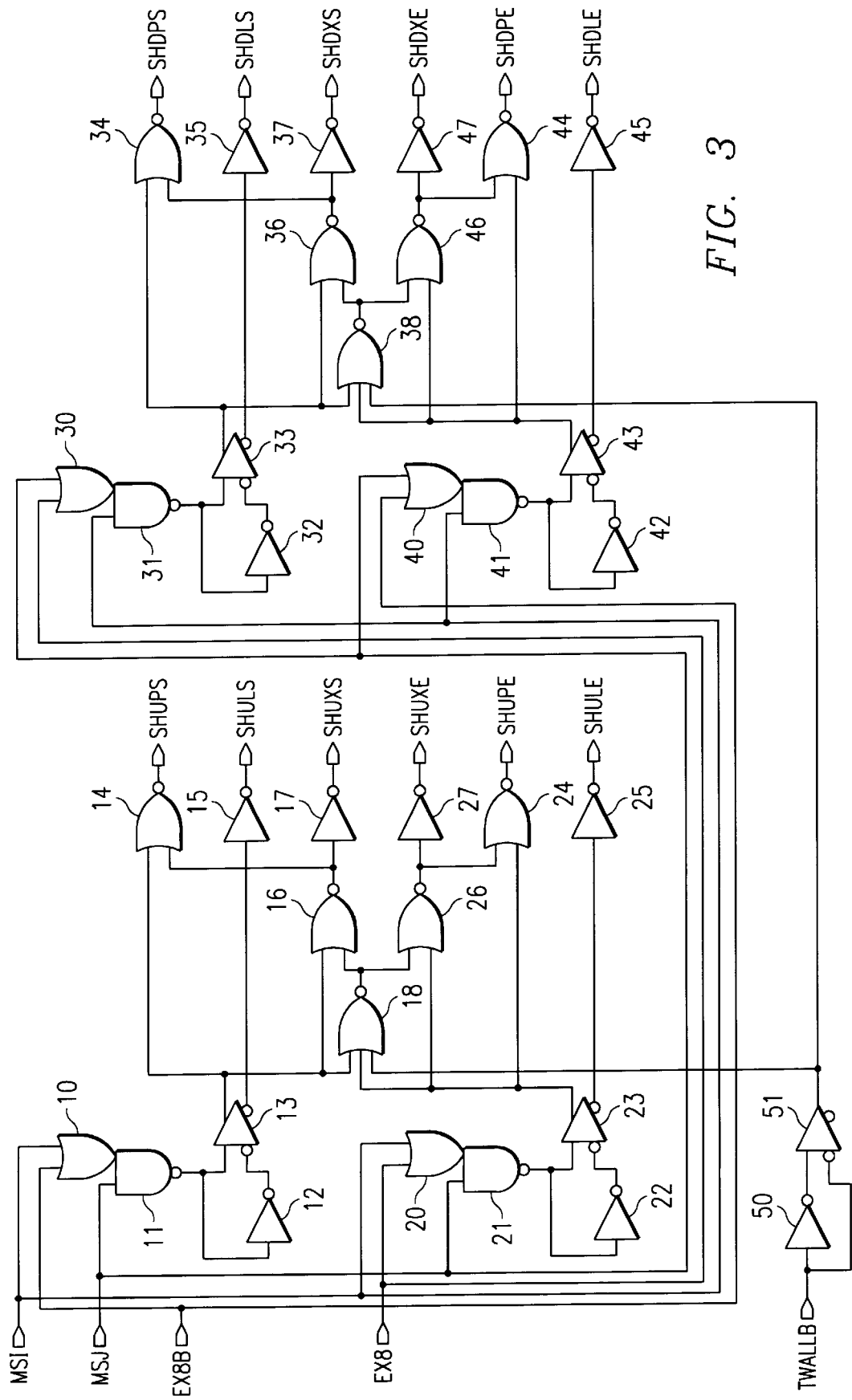
FIG. 3 is a circuit diagram showing the configuration of the control circuit.

FIG. 3 shows an example of the configuration of the control circuit 100, and FIG. 4 shows an example of the configuration of the driving buffer 110. Furthermore, the driving buffers 110 through 180 have almost the same configuration, and one of them 110 is shown as an example here.

Configurations and operations of the control circuit 100 and the driving buffers 110 through 180 will be explained with reference to FIGS. 3 and 4.

The control circuit 100 is configured with several logic gates and level shifters. In response to input signals MSI, MSJ, EX8B, EX8, and TWALLB, 12 output signals SHUPS, SHULS, . . . , and SHDLE are controlled.

Furthermore, the output signals SHUPS, SHULS, and SHUXS are supplied to the driving buffers 110 and 150 shown in FIG. 2; the output signals SHUXE, SHUPE, and SHULE are supplied to the driving buffers 120 and 160; the output signals SHDPS, SHDLS, and SHDXS are supplied to the driving buffers 130 and 170; and the output signals SHDXE, SHDPE, and SHDLE are supplied to the driving buffers 140 and 180.

In FIGS. 3, 13, 23, 33, 43, and 51 represent level shifters, and those signals whose levels change $V_{SS}$-$V_{DD}$ are converted into signals whose levels change $V_{SS}$-$V_{PP}$ by these level shifters. Here, $V_{SS}$ is a common potential being 0 V, for example; $V_{DD}$ is a source voltage being 3.3±0.3 V, for example; and $V_{PP}$ is a voltage higher than the source voltage $V_{DD}$ being 3.8 V, for example. Furthermore, the $V_{PP}$ is obtained through boosting by the source voltage $V_{DD}$.

In FIG. 3, the input signals MSI, MSJ, EX8B, EX8, and TWALLB are signals which are set to the source voltage $V_{DD}$ during a high level, and to the common potential $V_{SS}$ during a low level. OR gates 10, 20, 30, and 40; NAND gates 11, 21, 31, and 41; inverters 12, 22, 32 and 42; and an inverter 50 are logic gates to be operated by means of the source voltage $V_{DD}$. Other logic gates than these utilize the $V_{PP}$ as their operation voltage.

In the control circuit 100 shown in FIG. 3, signals MSI and EX8B are input into the input terminals of the OR gate 10. Output terminal of the OR gate 10 is connected to one of the terminals of the NAND gate 11, and signal MSJ is input into the other input terminal of the NAND gate 11. Output terminal of the NAND gate 11 is connected to the noninversion input terminal of the level shifter 13 as well as to the inversion input terminal of the level shifter 13 via an inverter INV 12.

NOR gate 18 has 3 input terminals, and these terminals are connected to respective noninversion terminals of the level shifters 13 and 23 and the output terminal of the level shifter 51. One of the input terminals of the NOR gate 16 is connected to the output terminal of the NOR gate 18, and the other input terminal is connected to the noninversion output terminal of the level shifter 13.

One of the input terminals of the NOR gate 14 is connected to the noninversion output terminal of the level shifter 13, and the other input terminal is connected to the output terminal of the NOR gate 16. Input terminal of the inverter 15 is connected to the inversion output terminal of the level shifter 13, and the input terminal of the inverter 17 is connected to the output terminal of the NOR gate 16.

The signal SHUPS is output from the output terminal of the NOR gate 14, the signal SHULS is output from the output terminal of the inverter 15, and the signal SHUXS is output from the output terminal of the inverter 17.

Furthermore, other circuit parts shown in FIG. 3 have almost the same configuration as the parts which generate the aforementioned signals SHUPS, SHULS, and SHUXS, so detailed explanation of the configurations of those circuits will be omitted.

The signals EX8 and EX8B are held to a high level during stand-by. In response, the output terminals of the OR gates 10, 20, 30, and 40 are all held to a high level.

In addition, because the signals MSI and MSJ are also held to a high level, the output terminal of the NAND gate 11 is held to a low level. In response, the noninversion output terminal of the level shifter 13 is held to a low level, and the inversion output terminal is held to a high level.

Furthermore, because the signal TWALLB is held to a high level, the output terminal of the level shifter 51 is held to a low level, and, in response, the output terminal of the NOR gate 18 is held to a high level.

In response to the aforementioned conditions, among the output signals SHUPS, SHULS, and SHUXS, SHULS is set to a low level; for example, the common potential $V_{SS}$ level; and other 2 signals SHUPS and SHUXS are both held to a high level, for example, the voltage $V_{PP}$ level.

In addition, initial conditions of the signals are set in almost the same manner at other constituents of the control circuit 100. As a result, like the signal SHULS, the signals SHULE, SHDLS, and SHDLE are held to a low level; and other signals are maintained respectively at a high level.

Levels of the input signals MSI, MSJ, EX8B, EX8, and TWALLB of the control circuit 100 are set respectively according to the address signal input and other control signals after access to the memory has begun.

In response, levels of respective output signals of the control circuit 100 are set. Signals of a total of 12 bits are output by the control circuit 100 and input respectively into the driving buffers 110 through 180.

FIG. 4 shows the configuration of the driving buffer 110 as an example. Upon receiving the input signals SHUPS, SHULS, and SHUXS, the driving buffer 110 controls the selection signal $S_{US1}$ to be applied to the selection signal line SHUS1 according to the levels of these input signals.

The driving buffer 110 is configured with a pMOS transistor PT1 and nMOS transistors NT1 and NTD1. The nMOS transistor NTD1 is a depletion type MOS transistor, and its threshold voltage $V_{th}$ is, for example, slightly higher than 0 V.

Drain of the nMOS transistor NTD1 is connected to the supply line of the source voltage $V_{DD}$, the source is connected to the selection signal line SHUS1, and the gate is connected to the terminal of the signal SHUPS.

The transistors PT1 and NT1 are connected in series between the voltage $V_{PP}$ and the common potential $V_{SS}$. That is, the source of the transistor PT1 is connected to the voltage $V_{PP}$, the source of the transistor NT1 is connected to the common potential $V_{SS}$, the drains of these transistors are connected to each other, and the contact point is connected to selection signal line SHUS1. The signal SHUXS is input into the gate of the transistor PT1, and the signal SHULS is input into the gate of the transistor NT1, respectively.

Figure 5:
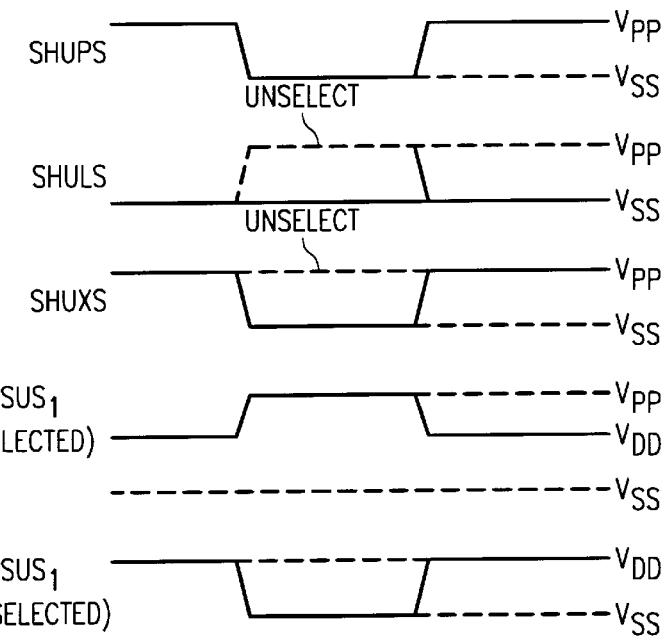
FIG. 5 is a diagram of the wave shapes showing the operations of the control circuit and the driving buffer.
Figure 6:
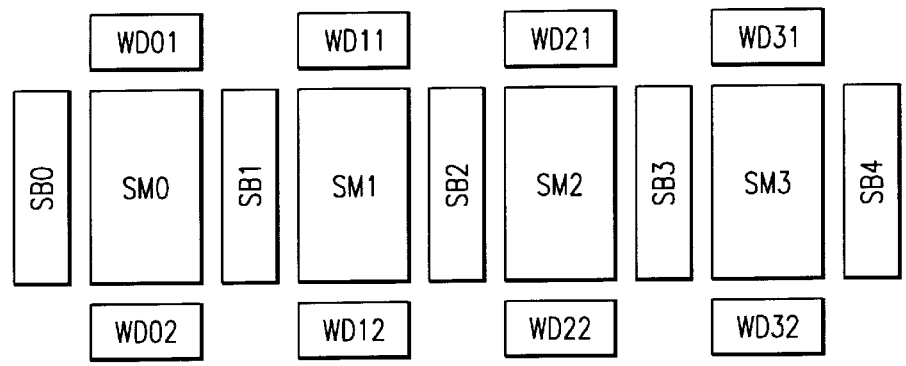
FIG. 6 is a block diagram showing a configuration example of a common DRAM.
Figure 8:
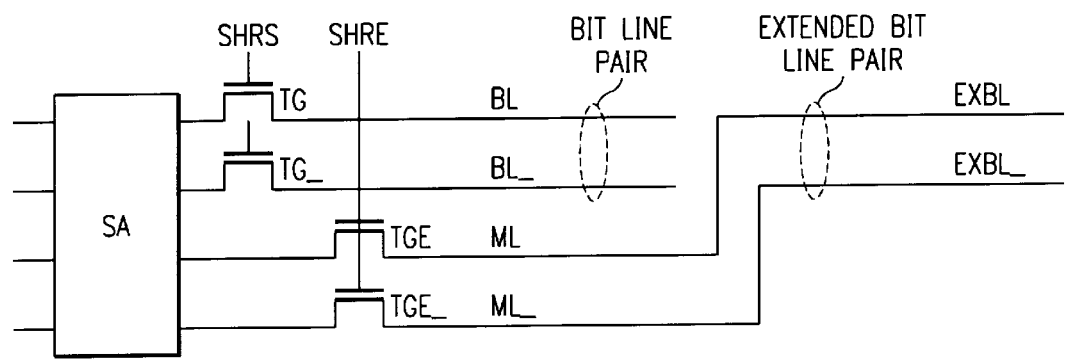
FIG. 8 is a circuit diagram showing the concept of the extended bit line method.
Figure 7:
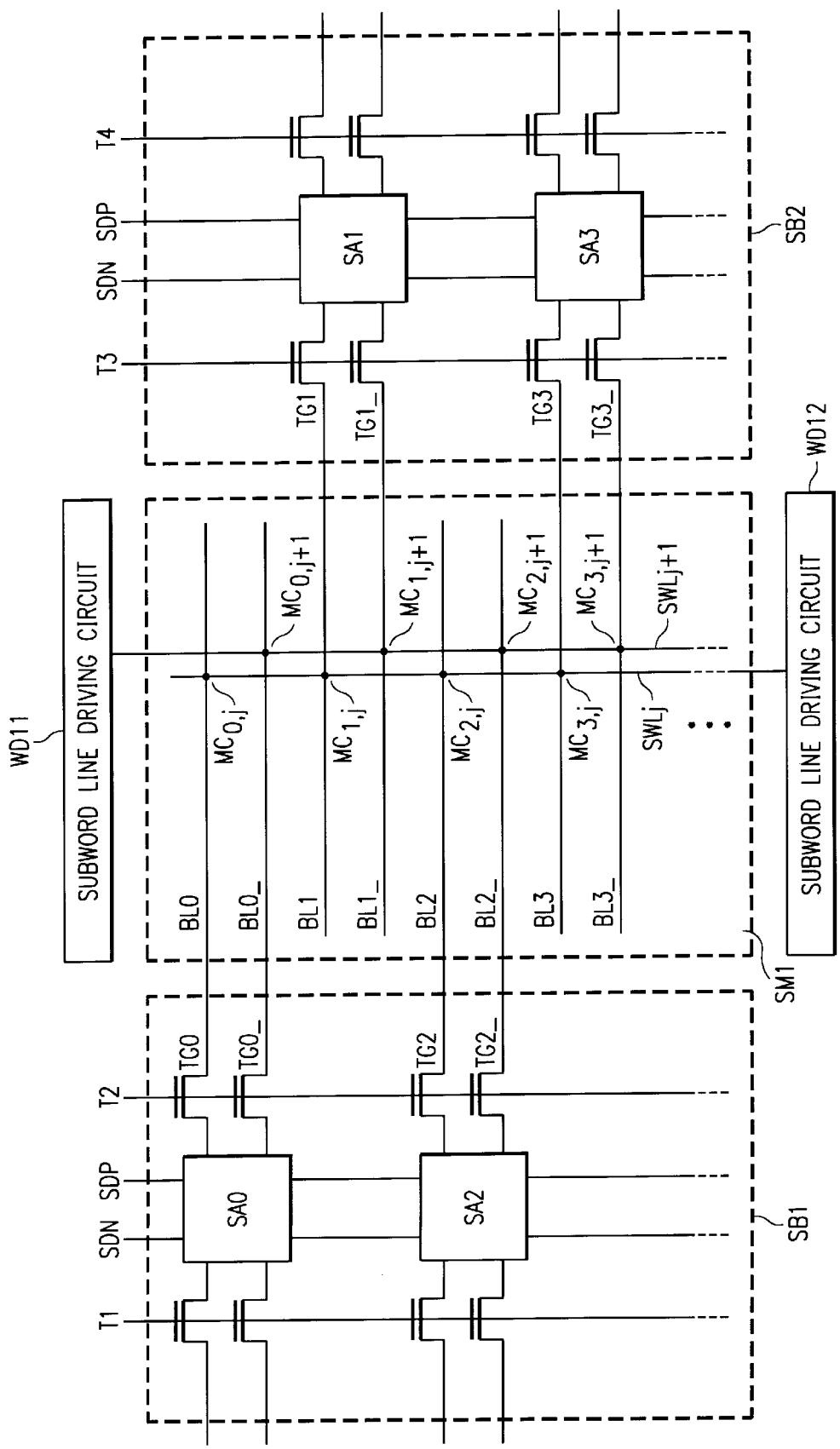
FIG. 7 is a circuit diagram showing the internal configuration of a DRAM.

FIG. 5 shows the signals SHUPS, SHULS, and SHUXS generated by the control circuit 100 as well as the wave shape of the signal $S_{US1}$ of the driving buffer output in response to [said signals]. Operations of the driving buffer will be explained below in reference to the diagram showing the wave shape.

As shown in the figure, during stand-by, the signals SHUPS and SHUXS are held to a high level; for example, to the voltage $V_{PP}$ level, by the control circuit 100, and the signal SHULS is held to a level, for example, to common potential $V_{SS}$ level.

In response, at the driving buffer 110 shown in FIG. 4, the nMOS transistor NTD1 is held to the off position, and the pMOS transistor PT1 and the nMOS transistor NT1 are held to the off position. As described above, because the nMOS transistor NTD1 is of a depletion type, its threshold voltage $V_{th}$ is slightly higher, for example, than 0 V.

As a result, when the nMOS transistor NTD1 is on, the signal $S_{US1}$ of the selection signal line SHUS1 is held to almost the same level as the source voltage $V_{DD}$. In other words, the selection signal lines are all maintained at the source voltage $V_{DD}$ level during stand-by regardless of their status as being selected or not. Meanwhile, the bit lines are precharged respectively and set to a prescribed potential; for example, the source voltage $V_{DD}$ or a similar level.

Next, output signals are set to prescribed levels respectively according to the output signals MSI, MSJ, EX8B, EX8, and TWALLB at the control circuit 100 at the time of memory access. In response, a prescribed selection signal line is selected and activated.

Furthermore, in the wave shapes of the signals SHULS and SHUXS in FIG. 5, the dotted lines indicate the status of unselect, and the solid lines indicate the status of select.

As shown in FIG. 5, the signal SHUPS is held to a low level, for example, to the common potential $V_{SS}$ level, regardless of the select/unselect status.

When the selection signal line SHUS1 is in select status, the signals SHULS and SHUXS are both held to a low level; for example, to the common potential $V_{SS}$ level.

Thus, for example, when the selection signal line SHUS1 is selected because the nMOS transistor NTD1 is set to off, the pMOS transistor PT1 is set to on, and the nMOS transistor NT1 is set to off at the driving buffer 110 in response to the output signals SHUPS, SHULS, and SHUXS from the control circuit 100, the signal $S_{US1}$ of the selection signal line SHUS1 is held to the voltage $V_{PP}$ level. On the contrary, when the selection signal line SHUS1 is not selected because the nMOS transistor NTD1 is set to off, the pMOS transistor PT1 is set to off, the nMOS transistor NT1 is set to on, and the signal $S_{US1}$ of the selection signal line SHUS1 is held to the common potential $V_{SS}$ level.

As described above, when the selection signal line SHUS1 is selected, the selection signal line SHUS1 is activated and held to the voltage $V_{PP}$ level in response to the output signal of the control circuit 100. On the other hand, when the selection signal line SHUS1 is not selected the selection signal line SHUS1 is held to the common potential $V_{SS}$ level in response to the output signal of the control circuit 100.

Thus, in FIG. 1, because the selection gate connected to the selection signal line SHUS1 is set to the on status to the left side of the sense amplifier SA0 when the selection signal line SHUS1 is selected, the bit line pair in the memory cell array SM0 not shown in the figure placed to the left side of the sense amplifier bank SB1a becomes connected to the sense amplifier SA0. Potential of the selected bit line is detected by the sense amplifier SA0 at the time of read, and the data stored in the selection memory cell is read. As described above, because the selection signal line SHUS1 is held to the common potential $V_{SS}$ level when it is not selected, the selection gate connected to said [selection signal line] is held in off status.

Of the 4 selection signal lines SHUS1, SHUE1, SHDS1, and SHDE1, only 1 [signal line] is selected by the control circuit 100 and the driving buffers 110–140 and 150–180 shown in FIG. 2 at the time of memory access, and other selection signal lines are held to unselect status. Similarly, of the 4 selection signal lines SHUS2, SHUE2, SHDS2, and SHDE2, only 1 [signal line] is selected, and other selection signal lines are held in unselect status.

Thus, at the time of memory access, in each memory cell array, only half the number of the bit line pairs or extended bit pairs are connected to the sense amplifiers in one of the neighboring sense amplifier banks, and the other half of the bit line pairs or the extended bit pairs are not connected to any sense amplifiers. As a result, while the memory capacity is increased, the load of the sense amplifiers at the time of memory access is restricted to almost the same degree as that of a memory with the conventional capacity; that is, a memory for which the extended bit line configuration is not adopted.

In the case of the memory cell array SM1 in FIG. 1, only 128 sets of bit line pairs or extended bit line pairs of the 256 sets of bit line pairs or extended bit line pairs are connected to respective sense amplifiers in the sense amplifier bank SB1a or the sense amplifier bank SB2a at the time of memory access. In addition, because the lengths of the bit line pairs or the extended bit line pairs to be connected to the sense amplifiers are halved through the adoption of the extended bit line configuration, the resistance and the capacitive load can be reduced to that extent, resulting in reduced power consumption.

As explained thus far, in the present embodiment, because the levels of the selection signal lines SHUS1, SHUE1, SHDS1, and SHDE1 are set by the control circuit, only one of the aforementioned four selection signal lines is selected at the time of memory access, other selection signal lines are held in unselect status, and the sense amplifiers in the sense amplifier bank SB1a and prescribed bit line pairs or extended bit line pairs are connected to each other in response to carry out read or write, the load of the sense amplifiers can be reduced, and large capacity and high integration can be achieved.

As explained thus far, the semiconductor memory of the present invention has an advantage in that the load of the sense amplifiers can be reduced, and as a result, the memory access speed and the accuracy of read can be improved. In addition, while attaining large capacity, increase in the load of the sense amplifiers can be restrained to the minimum, so large capacity and high integration can be achieved for a semiconductor memory.

We claim:

1. Semiconductor memory having first and second memory cell arrays in which memory cells are formed at the intersections of several bit line pairs and several extended bit line pairs extending in the same direction as that of said bit line pairs with several word lines, sense amplifier banks provided between the aforementioned memory cell arrays and which contain several sense amplifiers respectively connected to the bit line pair of the aforementioned first memory cell array via a first switching means, connected to the extended bit line pair of the aforementioned first memory cell array via a second switching means, connected to the bit line pair of the aforementioned second memory cell array via a third switching means, and connected to the extended bit line pair of the aforementioned second memory cell array via a fourth switching means, and a control circuit to control the conduction/nonconduction of the aforementioned first, second, third, and fourth switching means; wherein, the aforementioned control circuit makes one of the aforementioned first, second, third, and fourth switching means conductive and the others nonconductive in response to an address signal at the time of memory access.

2. Semiconductor memory described under claim 1, in which the aforementioned extended bit line pairs are connected to the aforementioned switching means via a metallic wiring layer formed above said extended bit line pairs.

3. Semiconductor memory described under claim 1, in which a precharge circuit to precharge the aforementioned bit line pairs and the aforementioned extended bit line pairs to a prescribed voltage is provided; and the aforementioned control circuit makes the aforementioned first, second, third, and fourth switching means conductive, and the aforementioned bit line pairs and the extended bit line pairs are precharged by the aforementioned precharge circuit, during stand-by status prior to memory access.

4. Semiconductor memory described under claim 1, in which the aforementioned first, second, third, and fourth switching means are configured with transistors, and a control signal is applied to their control terminals respectively from the aforementioned control circuit.

5. Semiconductor memory described under claim 4, in which the aforementioned control circuit applies a source voltage to the control terminal of the aforementioned respective transistors during stand-by status.

6. Semiconductor memory described under claim 4, in which the aforementioned control circuit applies a voltage higher than the source voltage to the control terminal of one of the aforementioned transistors and a common potential to other transistors at the time of memory access.

7. A semiconductor memory device comprising:

a. a first and second memory cell array b. memory cells formed at the intersections of bit lines and word lines, where the bit lines comprise bit line pairs and extended bit line pairs extending in the same direction as that of the bit line pairs;

c. sense amplifier banks provided between the first and second memory cell arrays which contain a plurality of sense amplifiers;

d. a plurality of switching means connecting the bit lines to one of the plurality of sense amplifiers, where a single sense amplifier is connected to a bit line pair and an extended bit line pair;

e. a control circuit to control the conduction/nonconduction of the switching means; wherein the control circuit makes at least one of the switching means conductive and the others nonconductive in response to an address signal at the time of memory access.

8. Semiconductor memory described under claim 7, in which the extended bit line pairs are connected to the switching means via a metallic wiring layer formed above the bit line pairs.

9. Semiconductor memory described under claim 7, in which a precharge circuit to precharge the bit line pairs and the extended bit line pairs to a prescribed voltage is provided; and the control circuit makes the switching means conductive, and the bit line pairs and the extended bit line pairs are precharged by the precharge circuit, during stand-by status prior to memory access.

10. Semiconductor memory described under claim 7, in which the switching means are configured with transistors, and a control signal is applied to their control terminals respectively from the aforementioned control circuit.

11. Semiconductor memory described under claim 10, in which the control circuit applies a source voltage to the control terminal of the respective transistors during stand-by status.

12. Semiconductor memory described under claim 10, in which the control circuit applies a voltage higher than the source voltage to the control terminal of one of the aforementioned transistors and a common potential to other transistors at the time of memory access.

* * * * *